United States Patent
Wiest et al.

(10) Patent No.: US 10,461,526 B2
(45) Date of Patent: Oct. 29, 2019

(54) EXPLOSION PROTECTION CIRCUIT WITH IMPEDANCE MATCHING

(71) Applicant: Endress + Hauser Flowtec AG, Reinach (CH)

(72) Inventors: Achim Wiest, Weil am Rhein (DE); Andreas Berger, Hasel-Glashutten (DE); Oliver Brumberg, Rheinfelden (DE)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 145 days.

(21) Appl. No.: 15/506,794

(22) PCT Filed: Aug. 19, 2015

(86) PCT No.: PCT/EP2015/069044
§ 371 (c)(1),
(2) Date: Feb. 27, 2017

(87) PCT Pub. No.: WO2016/030251
PCT Pub. Date: Mar. 3, 2016

(65) Prior Publication Data
US 2017/0256937 A1    Sep. 7, 2017

(30) Foreign Application Priority Data
Aug. 29, 2014    (DE) .......................... 10 2014 112 452

(51) Int. Cl.
*H02H 9/00*    (2006.01)
*G08C 19/02*    (2006.01)
(Continued)

(52) U.S. Cl.
CPC ............. *H02H 9/008* (2013.01); *G08C 19/02* (2013.01); *H01L 41/1132* (2013.01);
(Continued)

(58) Field of Classification Search
CPC .......... H02H 9/008; H02H 9/045; H02H 9/02; H03H 7/38; H01L 41/1132; H04Q 9/00;
(Continued)

(56) References Cited

U.S. PATENT DOCUMENTS 3,973,170 A * 8/1976 Hogan ................... H02H 9/008
                                                                361/41
4,708,022 A    11/1987 Johnson
(Continued)

FOREIGN PATENT DOCUMENTS

DE        2538911 A1    3/1976
DE        19934876 A1    2/2000
(Continued)

OTHER PUBLICATIONS

English Translation of the International Preliminary Report on Patentability, WIPO, Geneva, CH—dated Mar. 9, 2017.
(Continued)

*Primary Examiner* — Freddie Kirkland, III
(74) *Attorney, Agent, or Firm* — Bacon & Thomas, PLLC

(57) ABSTRACT

An apparatus for monitoring at least one physical or chemical process variable, comprising at least one sensor unit and an electronics unit for signal registration, evaluation and/or feeding, wherein the sensor unit is operated with alternating electrical current and/or communication between the electronics unit and the sensor unit occurs with alternating electrical current and/or alternating voltage. An explosion protection circuit with intrinsic safety, which includes a safety barrier, which has at least one unit for electrical current- and/or voltage limiting, is provided within the explosion protection circuit a unit for impedance matching, which unit for impedance matching includes at least one transformer.

13 Claims, 4 Drawing Sheets

(51) Int. Cl.
*H04Q 9/00* (2006.01)
*H01L 41/113* (2006.01)
*H02H 9/02* (2006.01)
*H02H 9/04* (2006.01)
*H03H 7/38* (2006.01)
*G01F 1/66* (2006.01)
*G01F 23/296* (2006.01)

(52) U.S. Cl.
CPC ............. *H02H 9/02* (2013.01); *H02H 9/045* (2013.01); *H03H 7/38* (2013.01); *H04Q 9/00* (2013.01); *G01F 1/66* (2013.01); *G01F 23/296* (2013.01); *H04Q 2209/886* (2013.01)

(58) Field of Classification Search
CPC .... H04Q 2209/886; G08C 19/02; G01F 1/66; G01F 23/296
See application file for complete search history.

(56) References Cited

U.S. PATENT DOCUMENTS

| | | | |
|---|---|---|---|
| 5,835,534 A * | 11/1998 | Kogure | H02H 9/008 375/257 |
| 5,907,292 A * | 5/1999 | Ahr | G08C 19/02 340/870.31 |
| 6,272,922 B1 * | 8/2001 | Stevens | G01F 23/0061 310/359 |
| 6,397,322 B1 * | 5/2002 | Voss | H02H 9/008 340/532 |
| 6,885,949 B2 | 4/2005 | Selli | |
| 7,791,228 B2 * | 9/2010 | Schaefer | H02H 9/008 257/683 |
| 8,736,113 B2 * | 5/2014 | Austerlitz | H02H 9/008 307/106 |
| 9,684,322 B2 * | 6/2017 | Cherewka | G05F 1/56 |
| 2007/0090963 A1 * | 4/2007 | Schaefer | H02H 9/008 340/693.1 |
| 2011/0187182 A1 | 8/2011 | Austerlitz et al. | |
| 2016/0072278 A1 * | 3/2016 | Kollmer | H02H 9/008 361/93.2 |

FOREIGN PATENT DOCUMENTS

DE 102014112452 A1 3/2016
EP 0817149 A1 1/1998

OTHER PUBLICATIONS

International Search Report, EPO, The Netherlands—dated Oct. 29, 2015.
German Search Report, German Patent Office, Munich, DE,—dated Apr. 29, 2015.

* cited by examiner

EXPLOSION PROTECTION CIRCUIT WITH IMPEDANCE MATCHING

TECHNICAL FIELD

The invention relates to an apparatus for monitoring at least one physical or chemical process variable comprising at least one sensor unit and an electronics unit for signal registration, evaluation and/or feeding, wherein the apparatus is suitable for use in explosion-endangered regions.

BACKGROUND DISCUSSION

In order to operate a field device in an explosive atmosphere, various measures are necessary. These have the goal of preventing a spark formation, which, in given cases, could trigger an explosion, or avoiding that a spark occurring in the interior of a closed space has effects on the environment. In this regard, different protection regions are distinguished, and correspondingly there are different standards for different environmental conditions and applications. The standard DIN EN60079-11 defines the necessary safety requirements for device protection by intrinsic safety, known under the abbreviation Ex-i. This is an ignition protection type, which rests on the limiting of electrical energy within devices and/or connecting lines, which are exposed to a possibly explosive atmosphere, to a level below that at which an ignition can be brought about either by spark formation or by heat. Moreover, different protection levels are distinguished within this protection class, namely Ex-ia, Ex-ib and Ex-ic. These define the existing failure safety of the individual components and connecting lines.

For an explosion protection under class Ex-I, it must especially be assured that the electrical variables, electrical current, voltage and power, lie in a device at all times below respective, predetermined limit values. These limits values are so selected that, in the case of malfunction, e.g. because of a short circuit, the maximum occurring heat is not sufficient to produce an ignition spark. In this regard, the electrical current is frequently kept below its predetermined limit value by resistances, the voltage below its predetermined limit value by diodes, especially zener diodes, and the power below its predetermined limit value by a suitable combination of electrical current- and voltage limiting components. Such a protection circuit can be purchased, for example, under the designation MCR-PLUGTRAB PT from the firm, Phoenix Contact, as a pluggable apparatus. With reference to field devices, further, a number of examples are known, for example, in European Patent, EP0882955A1, German Patent, DE29809853U1 or published international application, WO2004/098014A1, in the case of which the requirements for explosion protection are fulfilled by particular circuit arrangements. WO2004/098014A1 describes arrangements of series resistors especially for the units for electrical current- and voltage limiting, while DE29809853U1 provides the application of Zener diodes. The application of diodes has, however, the disadvantage that the applications are limited to a certain temperature range.

Furthermore, the above mentioned examples of explosion protection circuits have no impedance matching. This concerns especially field devices, in the case of which the communication between electronics unit and sensor element occurs by means of alternating electrical current or alternating voltage. Typical frequencies lie in the range from 10 kHz to 50 MHz. The problem is that the load impedance of the sensor element is often not matched to the line, respectively electronics unit. This leads to standing waves on the line. Because of this, the complete power cannot be transmitted. Examples of such field devices include those where the sensor element drives or is driven by at least one piezoelement. These concern, among others, ultrasonic, flow measuring devices or vibronic, fill level measuring devices, such as sold by the applicant in great variety, in the first case under the designations, PROSONIC DDU10, PROSONIC Proline P, or PROSONIC Flow, and in the second case, under the designations, SOLIFANT and LIQUIFANT.

A typical method for assuring impedance matching, especially to a piezoelement, applies coils or transformers. The respective components must, based on their characteristics, be matched to the line, to the electronics unit, which has, in this case, usually an amplifier, and to the piezoelement.

SUMMARY OF THE INVENTION

An object of the present invention is to provide a field device with an explosion protection circuit, which enables operation of the field device in an explosive atmosphere coupled with simultaneous transmission of signals with minimal power loss.

The object is achieved according to the invention by an apparatus for monitoring at least one physical or chemical process variable, comprising at least one sensor unit and an electronics unit for signal registration, evaluation and/or feeding, wherein the sensor unit is operated with alternating electrical current and/or communication between the sensor unit and the electronics unit occurs with alternating electrical current and/or alternating voltage, and an explosion protection circuit with intrinsic safety, which includes a safety barrier, which has at least one unit for electrical current- and/or voltage limiting, wherein there is provided within the explosion protection circuit a unit for impedance matching, which unit for impedance matching includes at least one transformer. The impedance matching permits, in such case, an as loss free transmission of the signals as possible and correspondingly makes available more energy for the sensor unit, since a universal matching is possible over a large interval between the impedances of the sensor unit and the electronics unit.

In such case, it is advantageous, when the unit for impedance matching is so embodied that the sensor unit and the electronics unit are galvanically isolated from one another.

A corresponding embodiment of the transformer provides additionally for a zone isolation. This is especially advantageous for media contacting sensor units having a housing of metal and cathodic protection of a pipeline conveying the medium. The cathodic protection means in such an application that the potential of the pipeline relative to the ground connection is held by means of a voltage source at a certain value, especially, for example, U=5V, in order to prevent corrosion of the pipeline. Application of an explosion protection circuit with galvanic isolation between sensor unit and electronics unit enables, in this case, an independent operation of the circuits. This is often not the case for conventional explosion protection circuits.

For such purpose, it is advantageous, when the transformer is so embodied, especially by assuring sufficiently large separations and suitable choice of materials such as lacquers and insulating films, that the galvanic isolation is assured.

In a preferred embodiment, the unit for electrical current limiting includes at least one resistor. Equally advantageous is when the unit for voltage limiting includes at least one coil. Such a choice of the voltage limiting components permits application of the apparatus of the invention in a broad temperature range, especially the possible temperature range is greater than in the case of application of diodes.

In such case, it is, furthermore, advantageous, when respectively equal components in the units for electrical current limiting, voltage limiting and impedance matching are designed in such a manner that they have a double function. Thus, for example, the unit for voltage limiting and the unit for impedance matching can be combined via the transformer. Furthermore, the ohmic resistances of the windings of the coils can likewise act for electrical current limiting.

In another preferred embodiment, the sensor unit includes at least one piezoelement. This is especially the case in the application of the apparatus of the invention for ultrasonic, flow measuring devices or for vibronic, fill level measuring devices. The at least one process variable is then, for example, the flow of a medium through a pipe or the fill level of a medium in a container or the density or viscosity of the respective medium.

It is, furthermore, advantageous, when the explosion protection circuit is arranged fixedly between the sensor unit and the electronics unit. Alternatively, the explosion protection circuit can also be arranged in a separate plug adapter, which plug adapter is retrofittably secured between the sensor unit and electronics unit. In this case, already existing devices can be subsequently retrofitted with an explosion protection circuit and/or impedance matching.

In an especially preferred embodiment, the number of parallel branches determines the failure safety, especially there is at least one single failure safety, when the explosion protection circuit has at least two parallel branches, and there is at least one double failure safety in the case of at least three parallel branches. This corresponds to the standard Ex-ib. In the case of a double failure safety, which is achieved in the case of three parallel branches, even the standard Ex-ia is fulfilled.

In such case, it is advantageous, when at least one component, which is provided within the units for electrical current- and/or voltage limiting, is embodied multiple times. This relates especially to the case with two parallel branches within the explosion protection circuit, since the two branches are then embodied equivalently. In the case of a single failure safety, for example, two electrical current limiting resistances and two voltage limiting coils would be redundantly embodied, while in the case of a double failure safety, in each case, three coils and three resistances would be redundantly embodied.

Furthermore, it is advantageous when at least one of the components is designed failure safely. This can be achieved, for example, by coils having a wire gage of $\varnothing > 0.05$ mm and a minimum failure voltage according to IEC of degree 2, by resistances, which are designed as wire resistances and which have a sufficient temperature resistance, and/or by conductive traces of corresponding cross section, especially height and width.

In another especially preferred embodiment, the explosion protection circuit includes a switch function. With this switch function, at least one unit for assuring intrinsic safety, especially the unit for electrical current limiting, can be shunted, especially short circuited. Thus, in the Not-Ex region, the transformer can be used without electrical current limiting, while in the Ex region a variant with electrical current limiting and zone isolation is provided.

In such case, it is especially advantageous, when the switch function can be changed only with a special tool, especially with a key-operated switch, or when it is located in a region of the apparatus, which is accessible only by means of a special tool.

It is advantageous, when the regions of the apparatus, which are possibly exposed to an explosive atmosphere, are pottable and/or potted.

It is, furthermore, advantageous, when between the explosion protection circuit and at least one additional component of the apparatus at least one connection is present, and when each connection is interruptible, or non-interruptible, only by tool.

BRIEF DESCRIPTION OF THE DRAWINGS

The invention will now be described in greater detail by means of the appended drawing based on a number of examples of embodiments. The figures of the drawing show as follows.

DETAILED DISCUSSION IN CONJUNCTION WITH THE DRAWINGS

Figure 1:
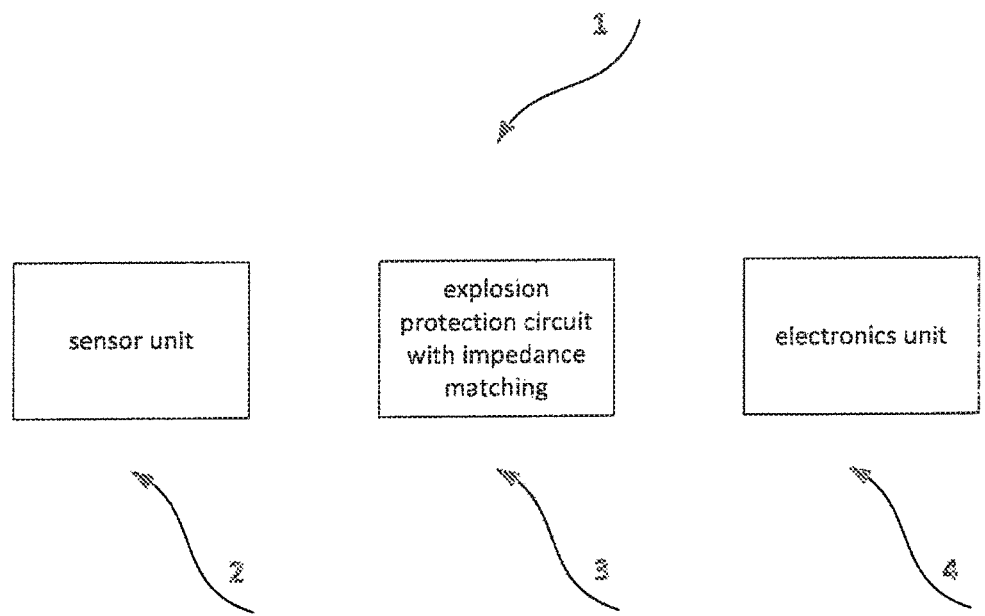
FIG. 1 is a block diagram of a field device according to the state of the art.

FIG. 1 shows a simplified block diagram of an apparatus 1 according to state of the art, such as, for example, a field device. The field device can be, for example, a flow measuring device working according to the ultrasonic principle. Such field devices are produced by the applicant in great variety and sold, for example, under the designation, Prosonic DDU10 or Prosonic Proline P. Other types of field devices also fall within the scope of the invention. As shown, apparatus 1 includes the sensor unit 2 and the electronics unit 4, between which is integrated an explosion protection circuit 3 of the invention. The explosion protection circuit 3 can be arranged fixedly, or provided in a separate plug adapter, which is placed releasably between the electronics unit 3 and the sensor unit 2.

Options for the explosion protection circuit include different variants, of which three different examples will be explained in detail below. Of course, many other arrangements can be provided, which also fall within the scope of the invention.

Figure 2:
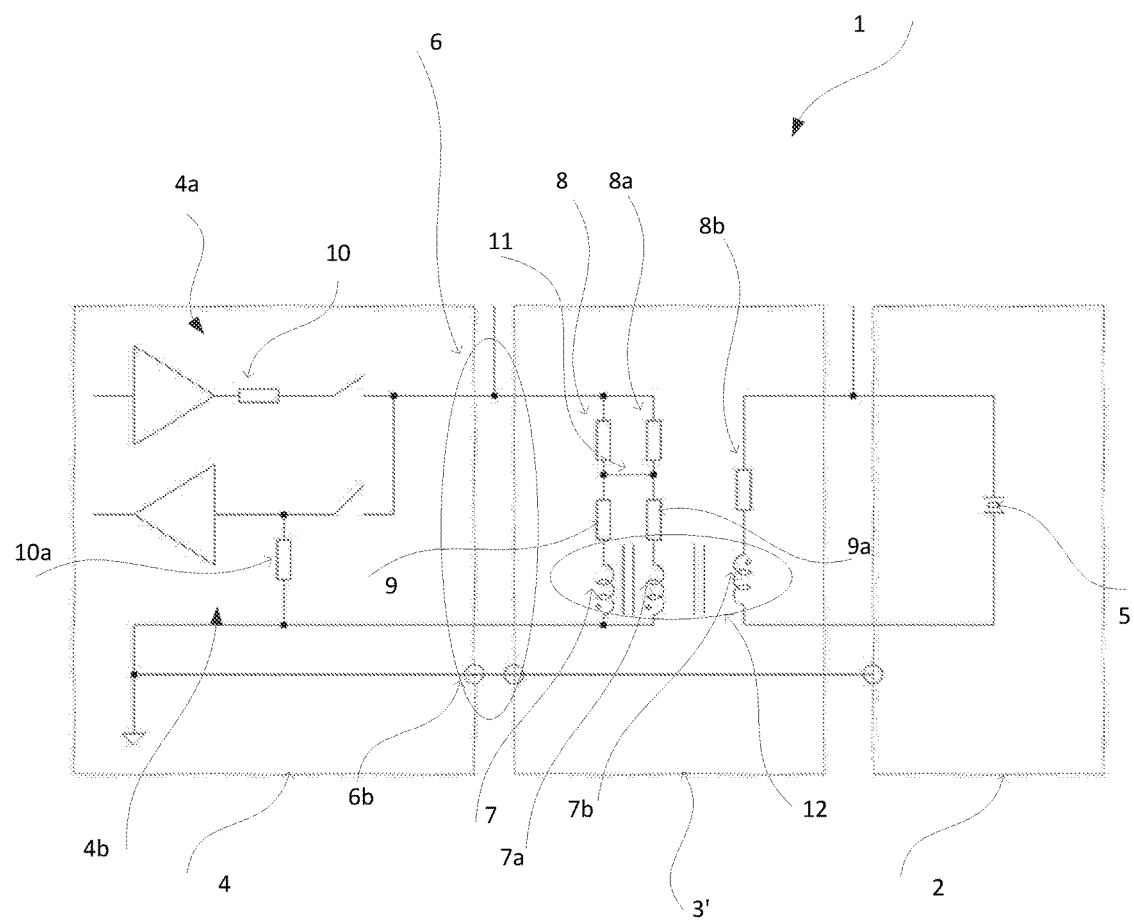
FIG. 2 is a circuit diagram of an explosion protection circuit of the invention with single failure safety.

FIG. 2 shows a circuit diagram of an explosion protection circuit 3' of the invention having single failure safety and arranged between the electronics unit 4 and the sensor unit 2. Sensor unit 2 includes a piezoelement 5, which is located within a metal shielding and to which the impedance is matched. The signal carrying lines are provided by triaxial cable 6, of which one conductor 6b is connected with the respective metal housing. Used for impedance matching is a transformer 12 having at least three windings. As a rule, transformers are embodied with two windings. The third winding serves here correspondingly not for impedance matching, but, instead, for explosion protection. Thus, the transformer 12 in the illustrated example of an embodiment has a double function. Besides the at least one additional winding, it is advantageous, when the winding handedness on the side with the piezoelement 5 is opposite that on the side toward the electronics unit 4. This acts in the case of malfunction to reduce the stored energy.

The following descriptions refer exclusively to the explosion protection circuit 3'. The two circuit branches on the left side have each a coil 7,7a with each a line resistance 9,9a and each a series resistor 8,8a for electrical current limiting. This redundant construction provides a single failure safety of the explosion protection circuit 3'. In a third circuit branch on the side with the piezoelement 5 is another coil 7b and the associated line resistance 8b. By suitable choice of the inductances and mechanical embodiment of the coils 7,7a, 7b, both the power can be suitably transformed, as well as also a zone isolation assured. The resistances 8,8a, in turn, serve for electrical current limiting. If one selects ohmic resistances, which are too low, then the electrical current is not sufficiently limited and the circuit assures only an impedance matching.

If the apparatus is operated in a non-explosion-endangered environment, such a choice of resistors 8,8a is advantageous, since more energy can be transmitted to the piezoelement 5. An explosion protection effect can only be achieved, when sufficiently high-valued ohmic resistances 8,8a are applied. It depends thus on the choice of the corresponding components and the desired application.

In the following, the explosion protective action of the circuit shown in FIG. 2 will be demonstrated based on a concrete example. In this regard, particular values are selected for the individual components and two energy considerations performed.

The inductive energy in a coil 7,7a,7b is given by $$E_{ind} = \frac{1}{2}LI^2.$$

If one takes into consideration a standard safety factor of 1.5 for the electrical current, in the case of a coil 7b with L=1500 µH and $E_{ind}$=20 µJ (maximum allowed energy in the coil: $E_{ind}$=40 µJ, taking into consideration a safety factor of 2) there results a maximum electrical current of $$I = \frac{\sqrt{\frac{2 \times 20\ \mu J}{1500\ \mu H}}}{1.5} = 0.163\ A$$

and correspondingly for the resistor in the case of U=10V (DC in the case of malfunction)

$$R = \frac{U}{I} = \frac{10\ V}{0.163\ A} = 61.4\Omega$$

Depending on choice of the series resistor 10 of the output stage 4a within the electronics unit 4, thus additional resistances 8,8a are necessary, in order to achieve a sufficient electrical current limiting. A typical value for the limiting resistor of the output stage 4a amounts to $R_{10}$=50Ω, so that the parallel circuit $R_s$ of the two resistances 8,8a would be selected at least high enough that $R_s$=61.4Ω–50Ω=11.4Ω.

Furthermore, a second resistor 10a is provided, the internal resistance of the input stage 4b. It is necessary for a reflection free transmission of the response signal. Typically selected for it is the same value that the limiting resistor 10 has. In the case of a matching of the alternating voltage during operation of the device, the sum of the impedances 7,7a,7b and resistances 8,8a should in the ideal case equal the value of $R_{10a}$=$R_{10}$, while $R_{10}$, in turn, corresponds to the wave resistance of the triaxial cable 6. Likewise, at the working frequency, the phase of the protection circuit with connected piezoelement 5 should be φ=0°. In the case of the resistors 8b,9 and 9a, these are the ohmic resistances of the windings.

A slight modification of the circuit of FIG. 2 is the provision of the connection 11. In this case, there results, due to the parallel circuit, $R_s$=22.8Ω. Thus, the additional connection 11 provides an increase of the resistance $R_s$ and, thus, a reduction of the electrical current. On the other hand, when the connection 11 is omitted, less voltage drops on the resistors 8,8a, so that more energy is available to the piezoelement 5.

Somewhat the same holds for the so-called shock test for a mechanical impact with 7 J on the piezoelement 5. The energy without inductance should according to standard not exceed a value of 50 µJ.

In the Case of the Capacitive Energy $$E_{kap} = \frac{1}{2}CU^2.$$

For a piezoelement with C=600 pF, a capacitive energy of $E_{kap}$=20 µJ as well as taking into consideration a safety factor of 2.5 for the energy, there results for the voltage on the piezoelement $$U_{piezo} = \sqrt{\frac{2 \times 20\ \mu J}{600\ pF}} = 258\ V$$

The maximum voltage would, thus, in the case of a mechanical impact with 7 J, lie below $U_{piezo}$=258V. By applying a coil 7b with L=1500 µH on the side with the piezoelement as well as the other two coils 8,8a, this voltage is not achieved.

Figure 3:
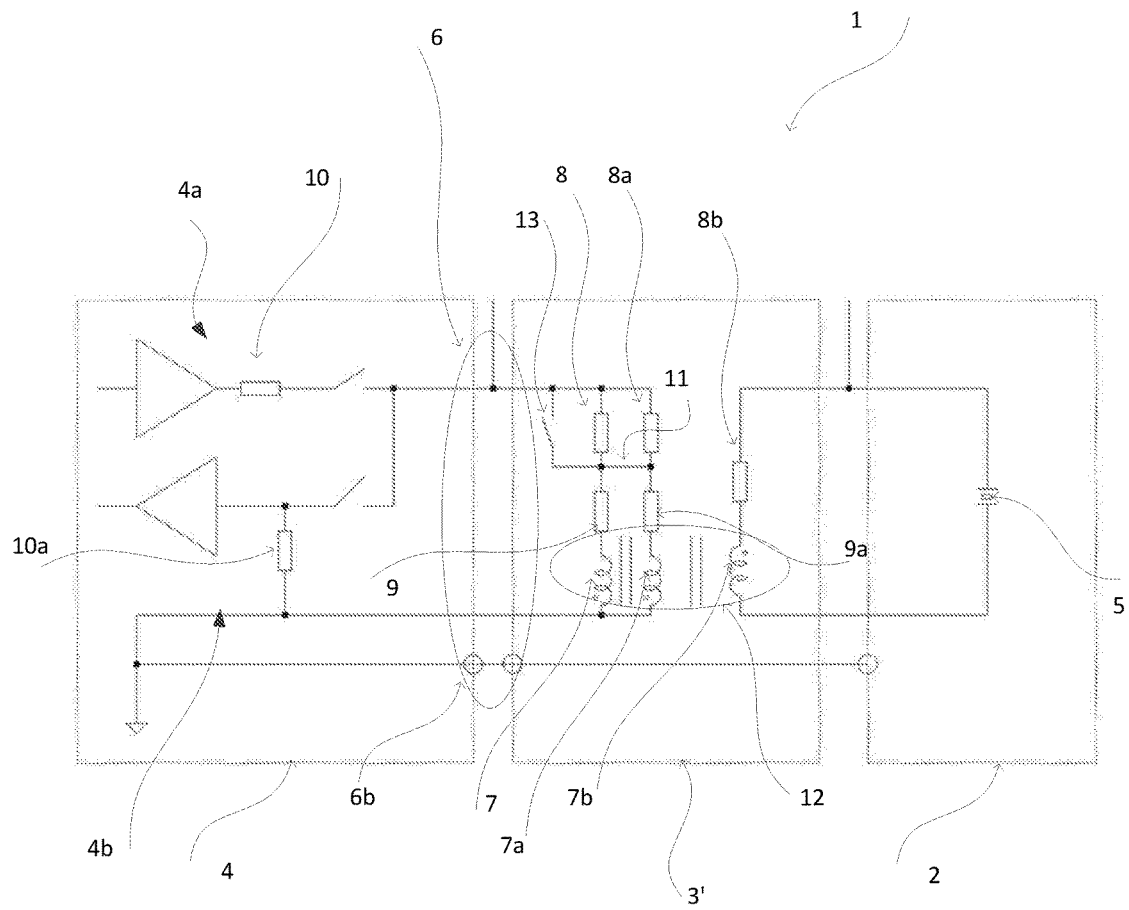
FIG. 3 is a circuit diagram of an explosion protection circuit of the invention with a switch function of the invention.

A second example of an explosion protection circuit 3" is shown in FIG. 3. FIG. 3 differs from FIG. 2 only by the adding of a switch 13. This enables shunting of the resistances 8,8a connected in series with the coils 7,7a, so that the apparatus can be operated selectively with or without explosion protection action. This makes the deciding between high, respectively low, ohm resistors 8,8a unnecessary since they can, at any time, be bypassed by means of the switch function.

Figure 4:
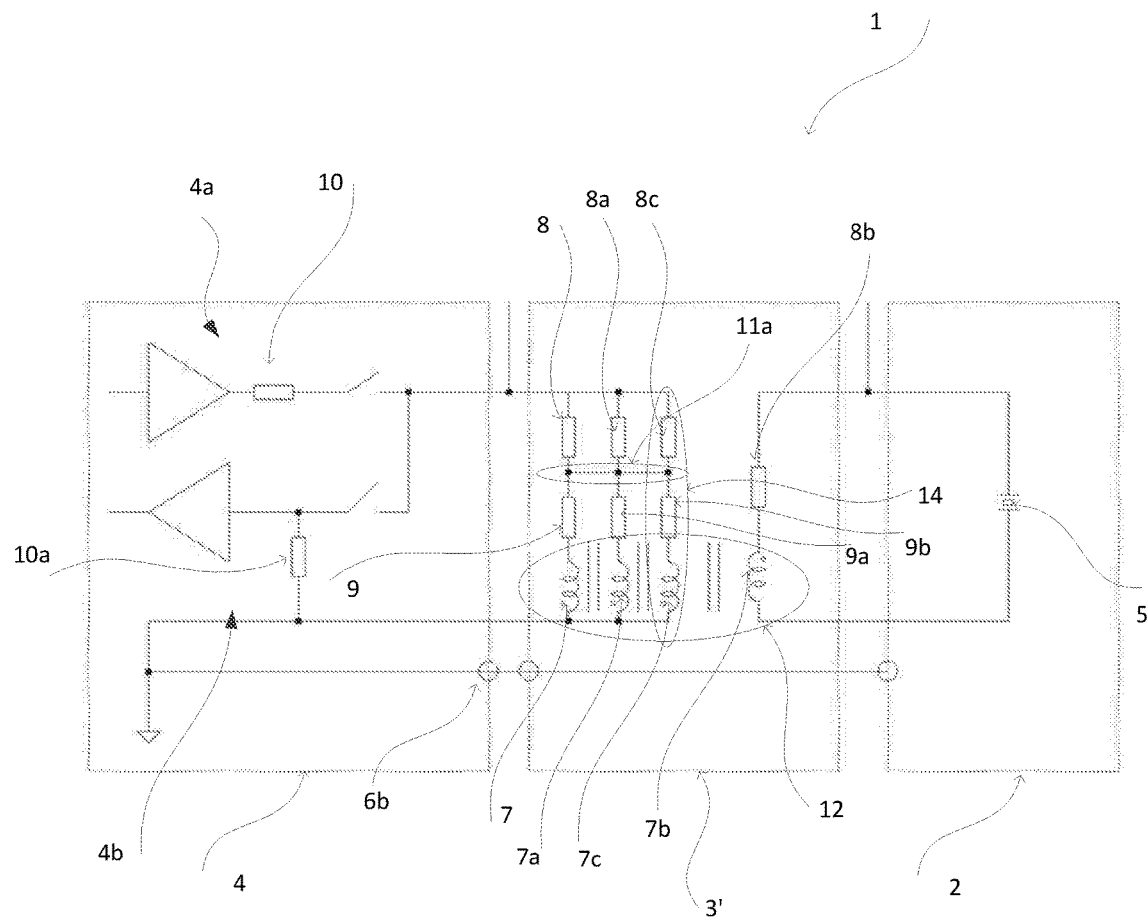
FIG. 4 is a circuit diagram of an explosion protection circuit of the invention with double failure safety.

A last example is shown in FIG. 4. In such case, of concern is an explosion protection circuit 3''' with double failure safety. This is achieved in the present example by a third circuit branch 14 on the side away from the piezoelement 5. In each of the circuit branches, a resistor 8,8a,8c is connected in series with a respective coil 7,7a,7c. Additionally, a connection 11a of the three circuit branches is added.

An alternative measure is to provide a sufficiently large separation between the circuit containing the piezoelement 5 and the circuit containing the three circuit branches. Then, higher voltages on the piezoelement can be used with little risk of a flashover during operation.

Of course, the essential functional units of the three illustrated examples are freely combinable with one another. This relates to the choice of the type of failure safety, the integration of additional switches, such as the switch function 13 in FIG. 3, and even the additional connection 11,11a. With reference to the individual components, the oscillatory circuits must then, however, be matched to the particular application.

In the case of a fixed arrangement of the explosion protection circuit, this can be arranged, for example, together with the circuit containing the piezoelement 5 in a potted housing. However, also other arrangements are, of course, implementable.

The invention claimed is:

1. Field device for monitoring at least one physical or chemical process variable, comprising:
    at least one transformer;
    at least one sensor unit;
    an electronics unit for signal registration, evaluation and/or feeding; and
    an explosion protection circuit, wherein:
    said at least one sensor unit is operated with alternating electrical current and/or communication between said electronics unit and said at least one sensor unit occurs with alternating electrical current and/or alternating voltage;
    said explosion protection circuit with intrinsic safety, which includes a safety barrier, which has at least one unit for electrical current and voltage limiting, said explosion protection circuit is arranged fixedly between said at least one sensor unit and said electronics unit, and,
    there is provided within said explosion protection circuit a unit for impedance matching, which unit for impedance matching includes said at least one transformer;
    wherein said at least one sensor unit has at least one piezoelement,
    and wherein said unit for voltage limiting includes at least one coil,
    wherein said piezoelement with said unit for voltage limiting are shockproof against a mechanical impact with an energy of 7 Joule according to DIN EN60079-11.

2. The field device as claimed in claim 1, wherein:
    said unit for impedance matching is so embodied that said at least one sensor unit and said electronics unit are galvanically isolated from one another.

3. The field device as claimed in claim 2, wherein:
    said at least one transformer is so embodied, by assuring sufficiently large separations and suitable choice of materials, lacquers and insulating films, that the galvanic isolation is assured.

4. The field device as claimed in claim 1, wherein:
    said unit for electrical current limiting includes at least one resistor.

5. The field device as claimed in claim 1, wherein:
    equal components in the units for electrical current limiting, voltage limiting and impedance matching are designed in such a manner that they have a double function.

6. The field device as claimed in claim 1, wherein:
    said explosion protection circuit is arranged in a separate plug adapter, which plug adapter is retrofittably secured between said at least one sensor unit and said electronics unit.

7. The field device as claimed in claim 1, wherein:
    a number of parallel branches within said explosion protection circuit determines failure safety, where there is at least one single failure safety, when said explosion protection circuit has at least two parallel branches, and at least one double failure safety in the case of at least three parallel branches.

8. The field device as claimed in claim 1, wherein:
    at least one component, which is provided within the units for electrical current- and/or voltage limiting, is embodied multiple times.

9. The field device as claimed in claim 1, wherein:
    at least one of the components is designed failure safely.

10. The field device as claimed in claim 1, wherein:
    said explosion protection circuit includes a switch function, and, with said switch function, at least one unit for assuring intrinsic safety is shuntable.

11. The field device as claimed in claim 10, wherein:
    said switch function can be changed only with a special tool, especially with a key-operated switch, or said switch function is located in a region of the apparatus, which is accessible only by means of a special tool.

12. The field device as claimed in claim 1, wherein:
    regions of the apparatus, which are possibly exposed to an explosive atmosphere, are pottable and/or potted.

13. The field device as claimed in claim 1, wherein:
    between said explosion protection circuit and at least one additional component of the apparatus at least one connection is present, and each connection is releasable, or non-releasable, only by a tool.

* * * * *